United States Patent
Parekh et al.

(10) Patent No.: US 6,440,850 B1
(45) Date of Patent: Aug. 27, 2002

(54) STRUCTURE FOR AN ELECTRICAL CONTACT TO A THIN FILM IN A SEMICONDUCTOR STRUCTURE AND METHOD FOR MAKING THE SAME

(75) Inventors: Kunal R. Parekh; Mark Fischer, both of Boise; Charles H. Dennison, Meridian, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/385,586

(22) Filed: Aug. 27, 1999

(51) Int. Cl.[7] .............................................. H01L 21/44
(52) U.S. Cl. ....................... 438/672; 438/597; 438/618; 438/622; 438/638; 438/639; 438/666; 257/773; 257/774
(58) Field of Search .................................. 257/296, 306, 257/311, 758, 773, 774, 775, 776, 905, 906; 438/253, 396, 657, 666, 618, 622, 629, 637–640, 672, 674, 675, 597

(56) References Cited

U.S. PATENT DOCUMENTS

| | | | |
|---|---|---|---|
| 5,250,458 A | * 10/1993 | Tsukamoto et al. | ........... 437/52 |
| 5,340,765 A | 8/1994 | Dennison | |
| 5,378,910 A | * 1/1995 | Yoshikawa | .................. 257/319 |
| 5,401,681 A | 3/1995 | Dennison | |
| 5,488,011 A | 1/1996 | Figura et al. | |
| 5,597,756 A | 1/1997 | Fazan et al. | |
| 5,604,147 A | 2/1997 | Fischer et al. | |
| 5,661,064 A | 8/1997 | Figura et al. | |
| 5,691,246 A | 11/1997 | Becker et al. | |
| 5,760,434 A | 6/1998 | Zahurak et al. | |
| 5,763,276 A | 6/1998 | Figura et al. | |
| 5,786,250 A | 7/1998 | Wu et al. | |
| 5,801,413 A | 9/1998 | Pan | |
| 5,849,624 A | 12/1998 | Fazan et al. | |
| 5,872,056 A | 2/1999 | Manning | |
| 5,880,036 A | 3/1999 | Becker et al. | |
| 6,117,785 A | * 9/2000 | Lee et al. | .................... 438/700 |
| 6,169,010 B1 | * 1/2001 | Higashi | ...................... 438/396 |
| 6,172,386 B1 | * 1/2001 | Jung et al. | .................. 257/295 |
| 6,268,658 B1 | * 7/2001 | Todorobaru et al. | ........ 257/763 |

* cited by examiner

*Primary Examiner*—Matthew Smith
*Assistant Examiner*—Craig P. Little
(74) *Attorney, Agent, or Firm*—Knobbe Martens Olson & Bear LLP

(57) ABSTRACT

A network of electrically conductive plate contacts is provided within the structure of a DRAM chip to enable storage of non-zero voltage levels in each charge storage region. An improved cell or top plate contact provides low contact resistance and improved structural integrity making the contact less prone to removal during subsequent processing steps. A top plate conformally lines a container patterned down into a subregion. A metal contact structure comprises a waist section, a contact leg, and an anchor leg. The contact leg makes contact to the top plate within the container interior. The waist section joins the top of the contact leg to the top of the anchor leg and extends over the edge of the top plate. The anchor leg extends downward through the subregion adjacent to but spaced from the container to anchor the structure in place and provide structural integrity. Accordingly, the present invention provides an improved structure for contact to a conductive thin film, having low contact resistance and an improved structural integrity.

34 Claims, 21 Drawing Sheets

STRUCTURE FOR AN ELECTRICAL CONTACT TO A THIN FILM IN A SEMICONDUCTOR STRUCTURE AND METHOD FOR MAKING THE SAME

BACKGROUND OF THE INVENTION

1. Field of the Invention

The present invention relates generally to the field of semiconductor manufacture and, more particularly, to a semiconductor device, e.g., a random access memory, incorporating an electrical contact to a conductive layer, e.g., a cell plate of a capacitive storage cell, formed in the interior of the semiconductor device.

2. Description of the Related Art

A dynamic random access memory (DRAM) chip is an example of a semiconductor device where reliable electrical contacts to an internal conductive layer must be provided. A DRAM chip typically includes several arrays of memory cells organized to store binary information through storage of different levels of voltage in a capacitive charge storage region of the DRAM chip. A transistor structure, including a plurality of transistors is provided in the DRAM chip to provide access to the charge stored in each charge storage region. Each transistor functions as an on-off switch to open the communication lines between the charge storage region and a microprocessor in communication with the DRAM chip.

A network of electrically conductive cell plate contacts is provided within the structure of the DRAM chip to enable storage of selected voltage levels in each charge storage region. Reliable storage is directly dependent upon the integrity of the cell plate contact. Cell or top plate contacts should exhibit low contact resistance. Accordingly, there is a continuing need for semiconductor devices incorporating reliable electrical contacts to internal conductive layers.

SUMMARY OF THE INVENTION

The present invention discloses a novel structure for making electrical contact to a conductive film in a semiconductor structure and a method for making the structure.

In accordance with one aspect of the invention, a contact structure is configured to make electrical contact to a conductive film of an integrated circuit. The structure includes a contact formed from a contiguous volume of conductive material, having a contact leg and an anchor leg. In the illustrated embodiment, the contact leg is formed in a container or depression lined with the conductive film, while the anchor leg extends downwardly generally parallel to the contact leg, beyond the edge of the conductive film. A waist section extends over the edge of the conductive film, joining the contact leg to the anchor leg.

In accordance with another aspect of the present invention, a method is provided for fabricating an electrical contact in an integrated circuit. The method includes providing an insulating layer and forming a conductive container in the insulating layer. A depression is formed in the insulating layer proximate the container. A contact is then formed by depositing a conductive material within a portion of the container and into the depression, making electrical contact to the conductive container.

BRIEF DESCRIPTION OF THE DRAWINGS

These and other aspects of the invention will be apparent to the skilled artisan in view of the detailed description below, the appended claims and the drawings, which are meant to illustrate and not to limit the invention, and in which:

FIGS. 2A–K illustrate cross-sectional views of a novel electrical contact structure and its method of fabrication according to the present invention;

DETAILED DESCRIPTION OF THE PREFERRED EMBODIMENT

A number of preferred embodiments of the invention will now be described with reference to the accompanying drawings. It is to be understood that other embodiments may be utilized and changes may be made without departing from the scope of the present invention. Where possible, the same reference numbers will be used throughout the drawings to refer to the same or like components. Numerous specific details are set forth in order to provide a thorough understanding of the present invention. However, one skilled in the art will readily find application for the structures and methods described herein in other contexts. In other instances, well-known methods, procedures, components, and devices have not been described in detail so as not to unnecessarily obscure aspects of the present invention.

Figure 1A:
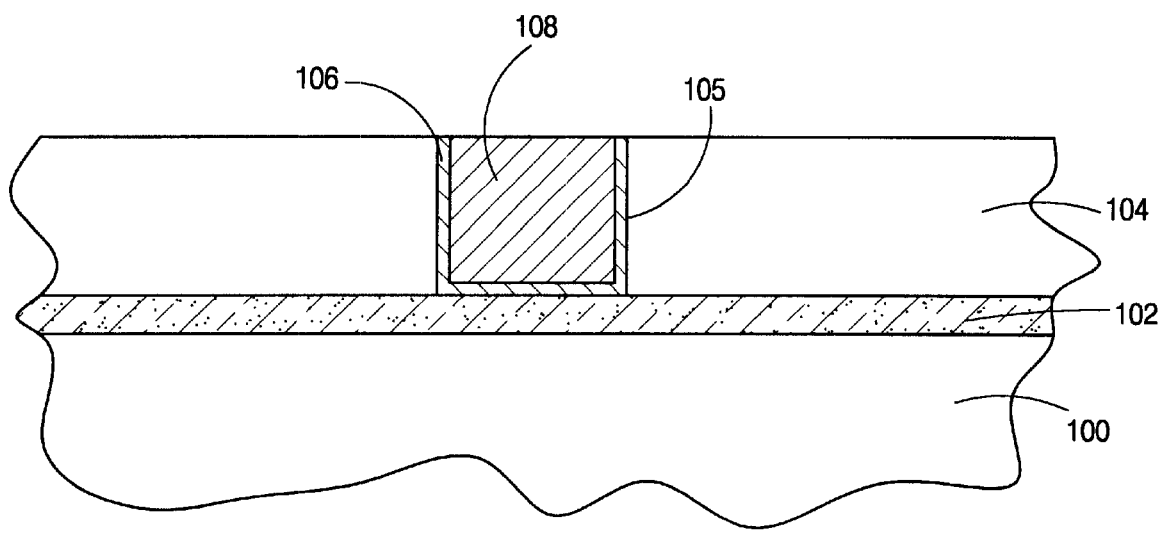
FIGS. 1A–B illustrate a first previous design for forming an electrical contact to a conductive film within a semiconductor structure.
Figure 1B:
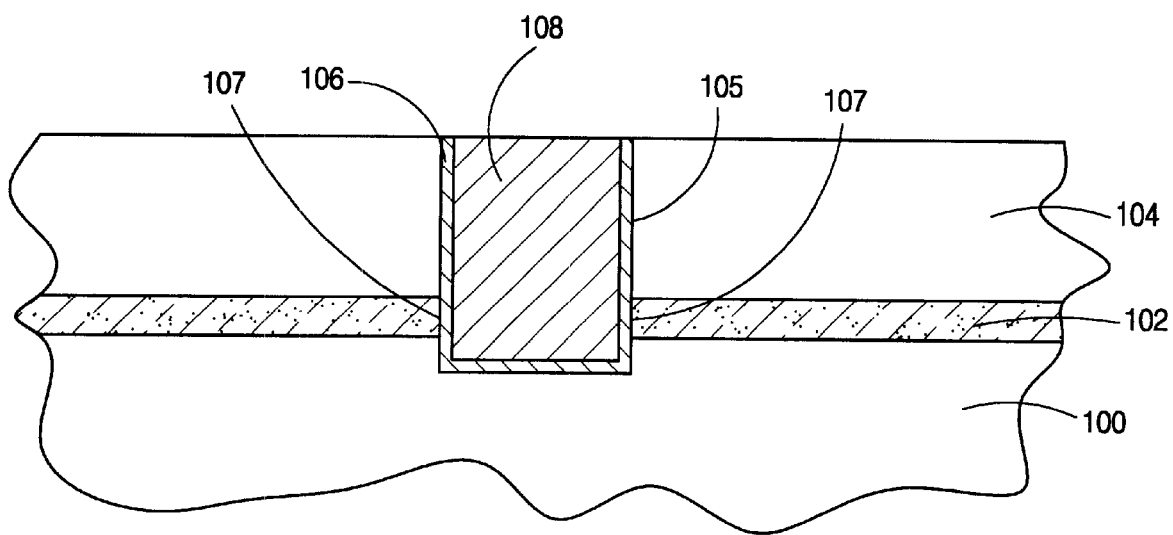
Figure 1C:
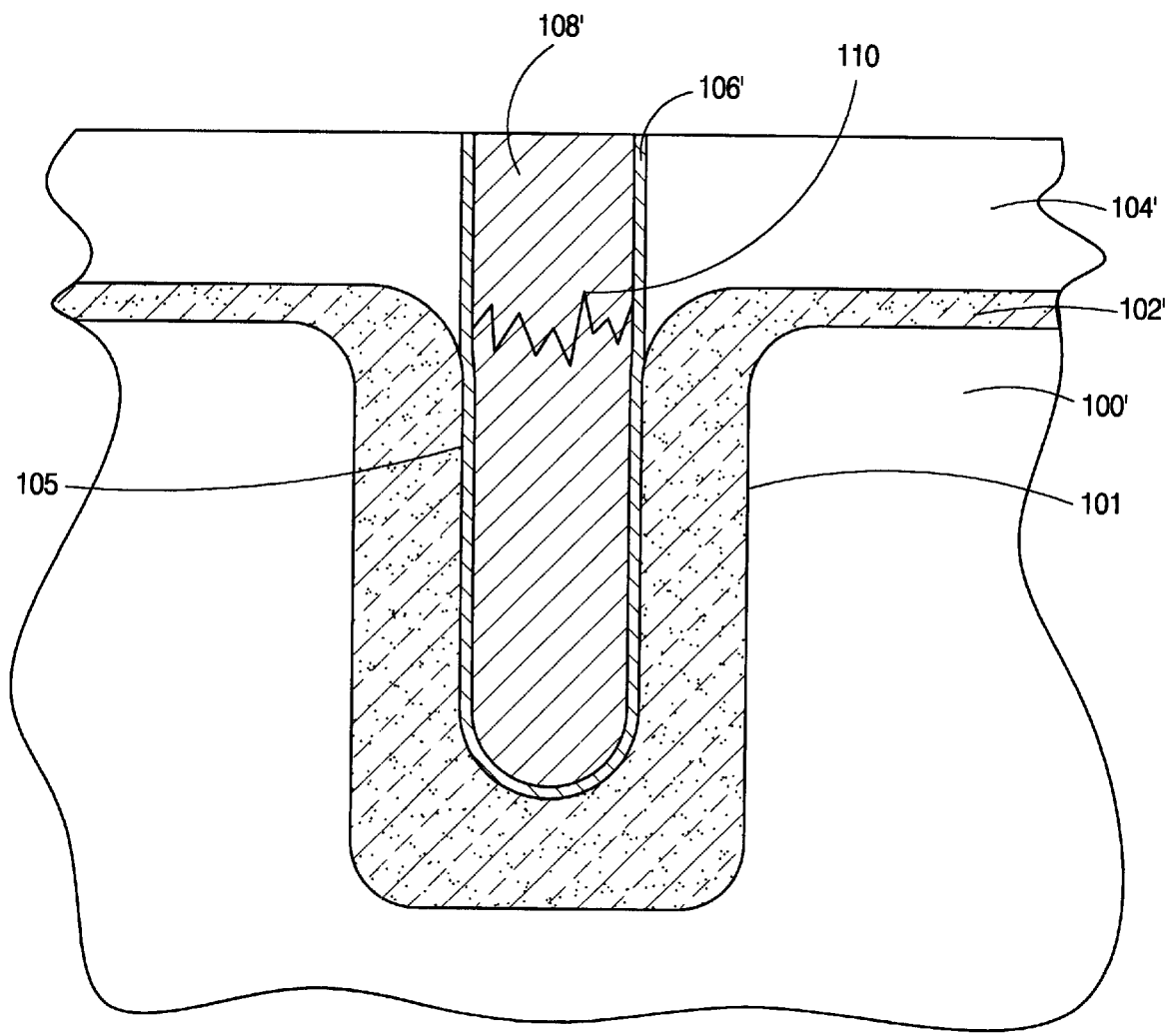
FIGS. 1C–E illustrate a second previous design for forming an electrical contact to a conductive film within a semiconductor structure.
Figure 1D:
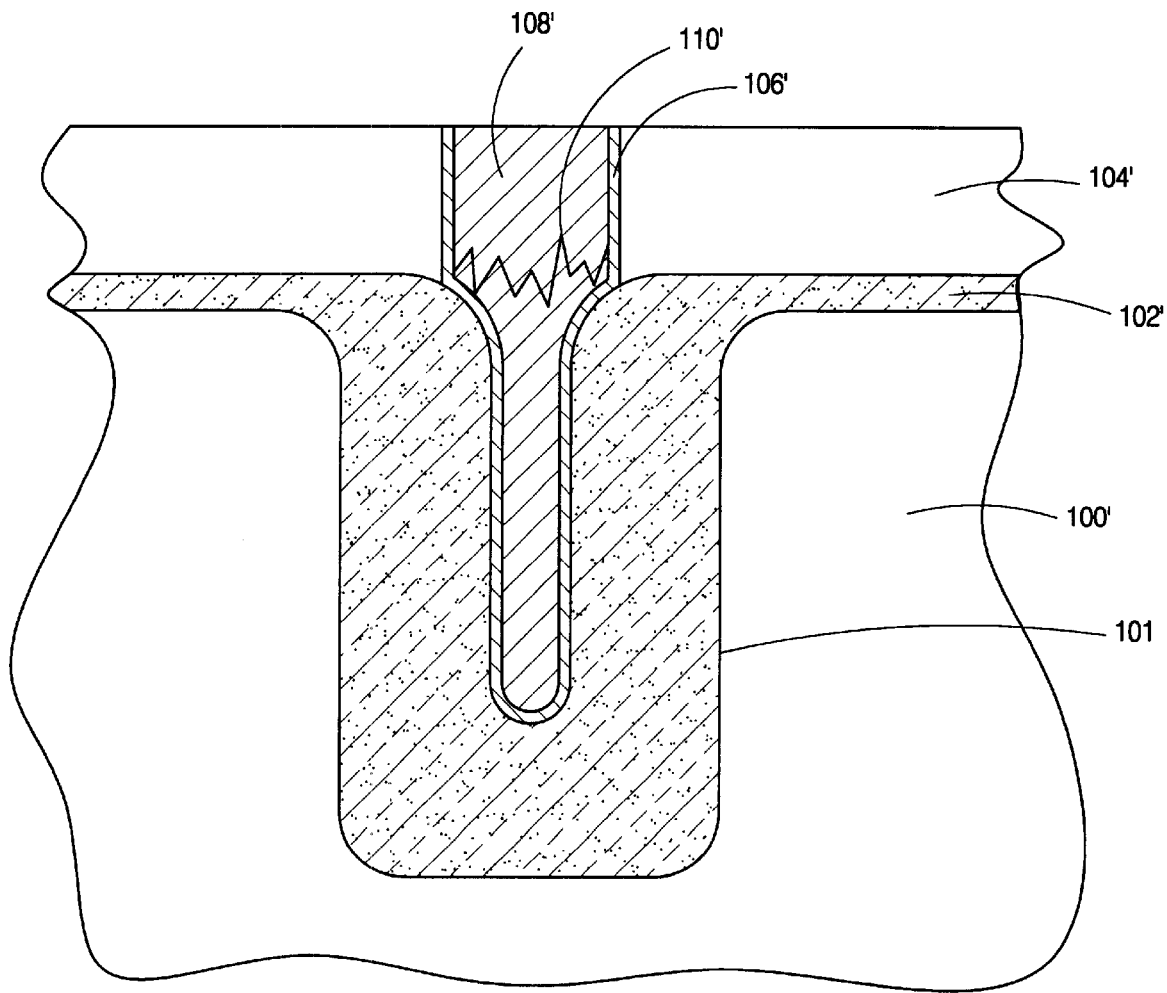
Figure 1E:
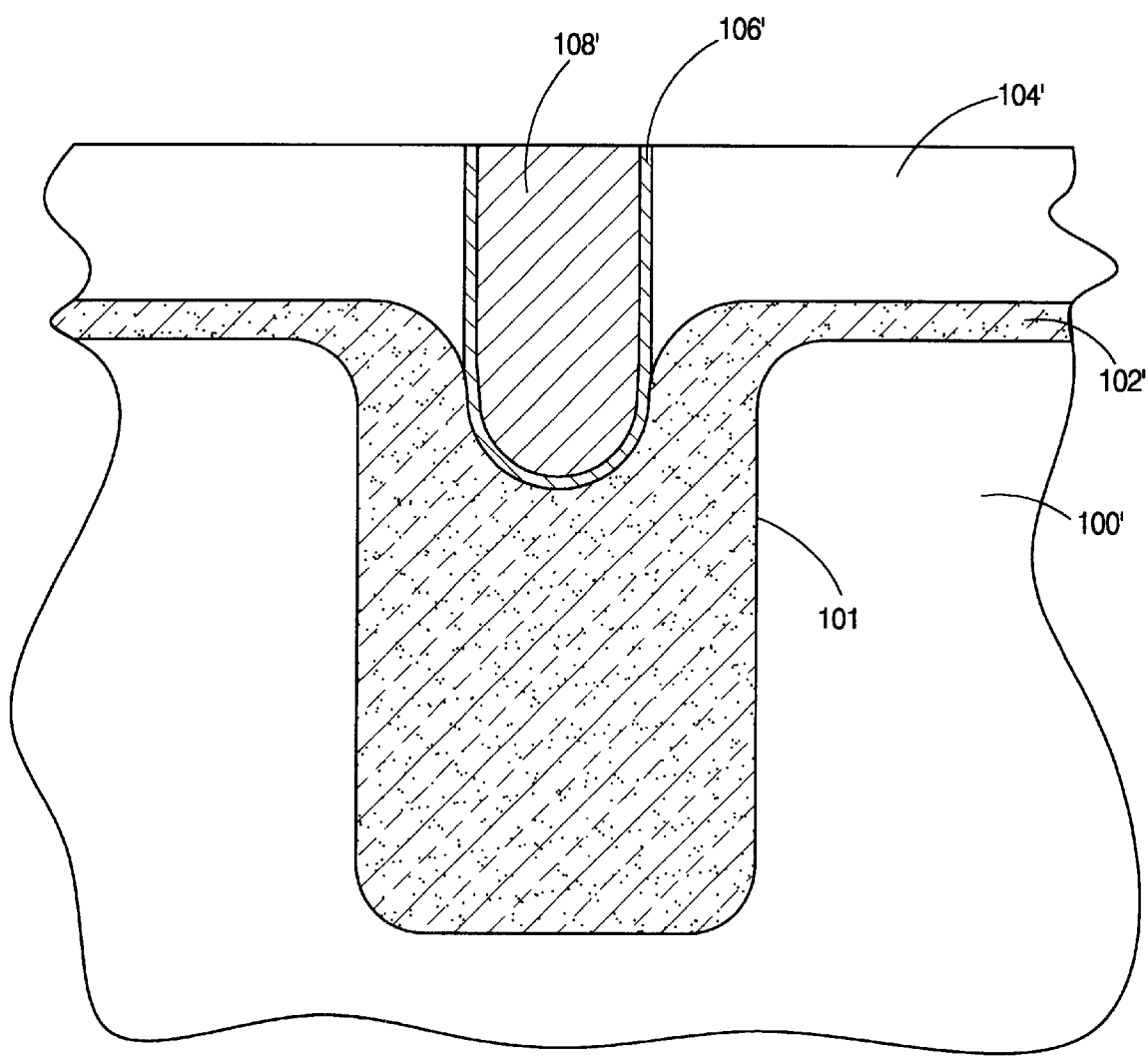

FIGS. 1A–B illustrate one previous design for forming an electrical contact to a conductive film within a semiconductor structure and FIGS. 1C–E illustrate a second previous design for forming an electrical contact to a conductive film within a semiconductor structure. The previous designs exhibit a number of shortcomings including, for example, a small contact surface area and an inability to remain intact or in place during subsequent processing steps.

Referring to FIG. 1A, a conductive film 102, such as, for example, doped polysilicon, is deposited on top of an insulating layer 100. A second insulating layer 104 is deposited on top of the conductive film 102. A contact via 105 is patterned within the second insulating layer 104 and the via 105 is lined with a titanium silicide and titanium nitride layer 106 to promote adhesion and an appropriate electrical contact as is well known in the art. Finally, a metal plug contact 108 is deposited within the via 105.

A first problem with this configuration is that the metal plug contact 108 is of a very low profile geometry. The low profile geometry makes the plug contact 108 prone to being pulled out during subsequent processing steps such as, for example, chemical mechanical polishing. In particular, the chemical mechanical polishing process may erode away the titanium nitride adhesive layer 106 along the vertical walls of the via 105 between the insulating layer 104 and the metal plug contact 108. Once the adhesive layer 106 has been weakened along the walls of the via 105, the plug is only held in place by its base and is susceptible to undercutting during wet clean.

As illustrated in FIG. 1B, a second problem with the present configuration may occur when the etch used to make the via 105 passes through the conductive film 102 into the insulating layer 100. In this case, the contact of the metal plug 108 to the conductive film 102 consists of a ring 107, which has a very small surface area that will likely result in a high resistance.

FIG. 1C illustrates an alternative previous design for a contact to a conductive film 102'. In this configuration, a container 101 is first patterned, e.g. by etching, into an insulating layer 100'. Next, a conductive film 102' is deposited along the surface of the insulating layer 100' and into the container 101. A second insulating layer 104' is then deposited over the conductive film 102'. Next, the second insulating layer 104' is patterned, stopping at the conductive film 102'. The vertical walls of the conductive film 102' within the container 101 provide added surface area and structural strength for the metal plug contact 108'.

The structure of FIG. 1C, however, also has deficiencies. During subsequent processing, the structure can break, for example, at a point 110, and the top portion of the metal plug contact 108' can pull out. This breakage can be caused, for example, by the lateral forces imposed during chemical mechanical polishing. Also, as illustrated in FIGS. 1D and 1E, variation in the process steps can result in metal plug contacts with little additional strength and surface area over the structure of FIGS. 1A and 1B. The resulting structure of FIG. 1D is very susceptible to breakage at point 110' due to a narrowing of the fill in a crowded container 101. The resulting structure of FIG. 1E has little advantage over the structure of FIG. 1A. In the structure of FIG. 1E, the conductive film 102' is deposited too thickly. As a result, the filled container 101 leaves no more contact surface than a planar contact landing.

As illustrated in FIGS. 2A–K, to overcome the aforementioned deficiencies in previous designs, the present invention provides a novel contact structure 280 (FIG. 2K) for a reliable electrical contact to a conductive film layer 240 and a method of fabrication of the structure 280. FIGS. 2A–K are not necessarily drawn to scale and need not correspond to the dimensions of an actual structure constructed in accordance with the present invention.

In a preferred embodiment, the contact structure 280 is constructed using a number of steps shared in common with the formation of capacitive storage cells during the construction of DRAMs. The contact structure 280 of the preferred embodiment is used to make contact to the periphery of a top cell plate of an array of capacitive storage cells. The capacitive storage cells, formed by any suitable process, are preferably also used to form the disclosed cell plate contact structure 280 without any additional process steps. The contact structure 280 thus shares a similar structure with the capacitive storage cells. Exemplary process flows for forming high surface area capacitors are described, for example, in U.S. Pat. No. 5,760,434 to Zahurak, titled "Increased interior volume for integrated memory cell." The illustrated containers are preferably formed by a sequence similar to that disclosed in U.S. Pat. No. 5,340,765, the disclosure of which is hereby incorporated by reference. The skilled artisan will readily appreciate other suitable processes for forming high surface area capacitors, including capacitor studs, final structures, trench capacitors, etc.

Figure 2A:
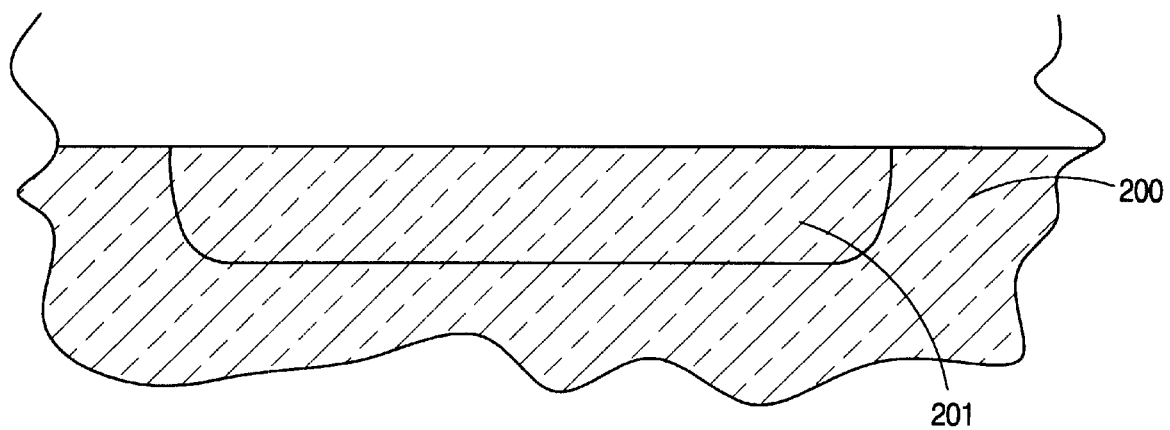

Initially, a substrate 200 is provided as illustrated in FIG. 2A. The substrate 200 may contain a number of semiconductor structures that may occupy part or all of a silicon wafer forming the substrate 200. In the preferred embodiment an active area 201, biased to the same voltage as the contact to the conductive film layer 240, is formed within a semiconductor substrate 200. Alternatively, the substrate 200 may be a semiconductor, an insulator, or an appropriately insulated conductor and the semiconductor structures may comprise any of a variety of other materials or assemblies operative to function as a semiconductor, e.g., a semiconductor layer formed on an insulating layer, a semiconductor region formed within an insulating layer, etc.

Figure 2B:
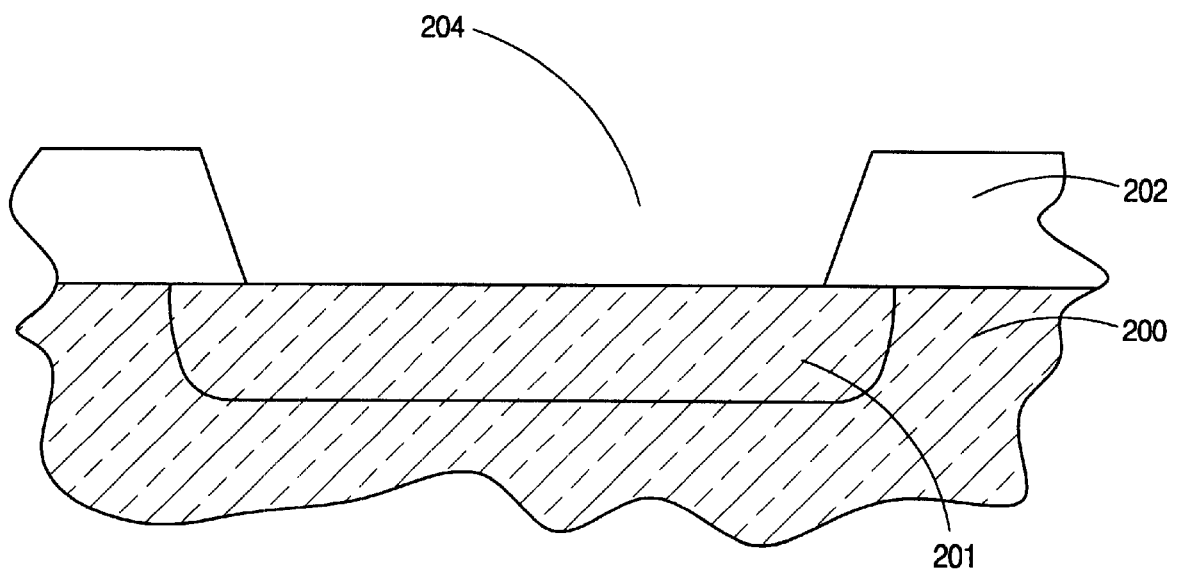

Referring now to FIG. 2B, a first insulating overlayer 202 is formed over the substrate 200. The first insulating overlayer 202 typically comprises a glass insulating layer, e.g., borophosphosilicate glass, but may comprise any suitable electrically insulating layer. A via 204 is preferably formed within the first insulating overlayer 202 by photolithographic patterning and etching. In the preferred embodiment, the via 204 is formed over the active area 201.

Figure 2C:
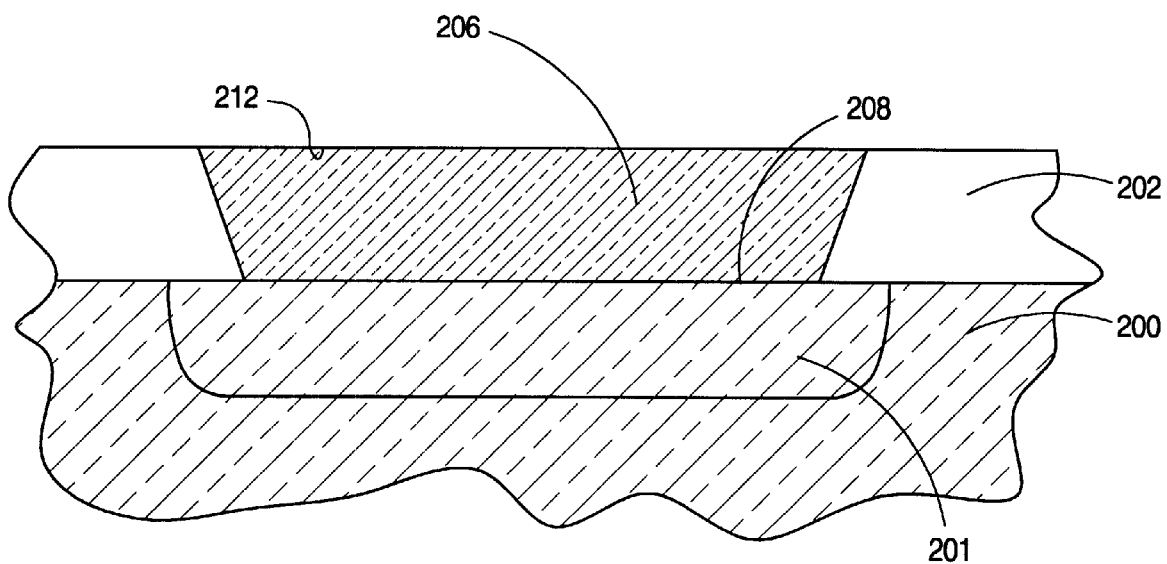

Referring to FIG. 2C, a patterning stop region 206 is deposited or formed in the via 204. The patterning stop region 206 is formed such that it comprises a lower patterning stop region surface 208 in contact with the substrate 200 and an upper patterning stop region surface 212. The patterning stop region 206 can comprise a conductive or non-conductive material, depending upon the desired characteristics of the resulting contact structure 280 (FIG. 2K). In the preferred embodiment, the patterning stop region 206 is formed from phosphorous doped polysilicon to yield a conductive region that forms a conductive path to the active area 201.

Figure 2D:
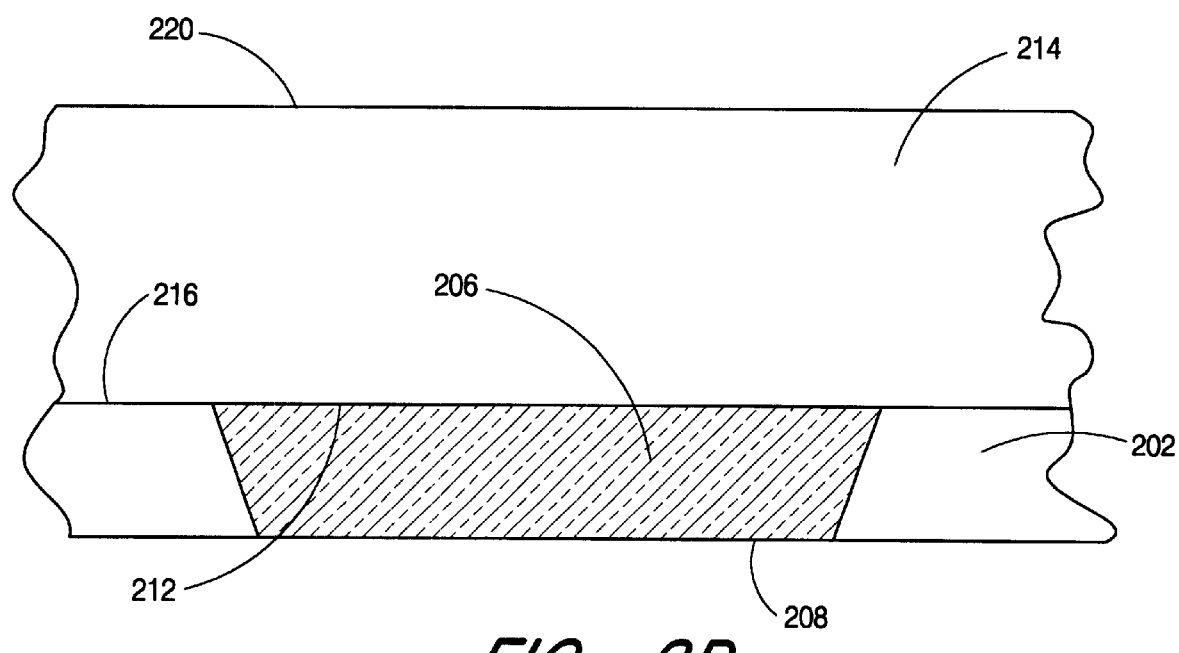

Referring to FIG. 2D, a second insulating overlayer 214 is formed over the first insulating overlayer 202 and the patterning stop region 206. The second insulating overlayer 214 is formed such that it comprises a lower overlayer surface 216 in contact with the first insulating overlayer 202 and the patterning stop region 206 and an upper overlayer surface 220. The second insulating overlayer 214 typically comprises a glass insulating layer, e.g., borophosphosilicate glass, but may comprise any electrically insulating layer which permits removal of portions thereof by etching, photo patterning, or another process.

Figure 2E:
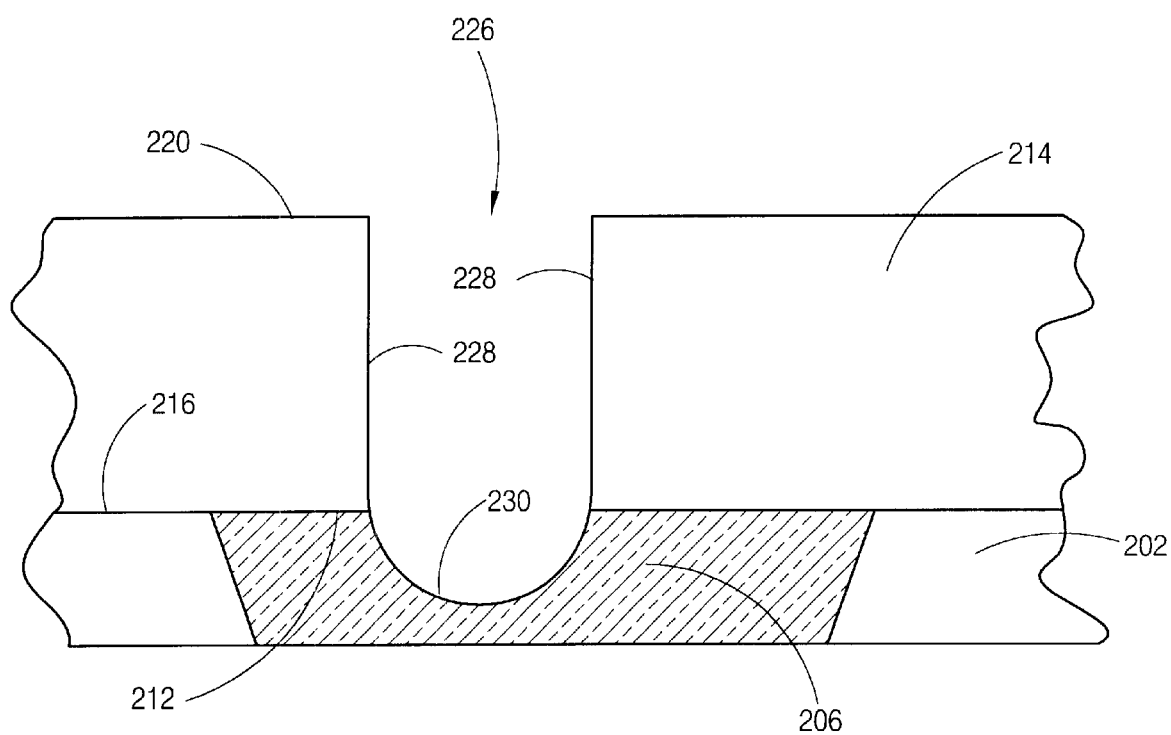

Referring now to FIG. 2E, a container or depression 226 is formed in the second insulating overlayer 214 by photolithographic patterning and etching through the upper overlayer surface 220 and the lower overlayer surface 216. In the preferred embodiment, the container 226 extends past the lower overlayer surface 216 into the patterning stop region 206. The container 226 is patterned such that it defines a container cross-section having container side walls 228 and a container bottom wall 230.

The container 226, and other areas patterned according to the present invention, are typically patterned by a photo lithography and etching process. It will be understood that a variety of material removal processes can be used to pattern the container 226, e.g., wet or dry etching, ion milling, reactive ion etching, etc.

In the preferred embodiment, the container 226 is formed simultaneously with and using the same process steps as the capacitive storage cells of the DRAM chip. The container 226 also uses a structure similar or identical to the containers of the capacitive storage cells. The container 226 is essentially a dummy capacitive storage cell that is used to make contact to the upper cell plate of the capacitive storage cells. In the preferred embodiment, the aspect ratio of the container's depth to its width is preferably greater than about 1 to 1, more preferably greater than about 2 to 1.

It is contemplated by the present invention that structure referred to herein as a wall may include surfaces other than vertical or horizontal surfaces, e.g., inclined surfaces or surfaces having a variety of curved or linear profiles. For the purpose of the present description, a portion of an object includes all or part of that object.

Figure 2F:
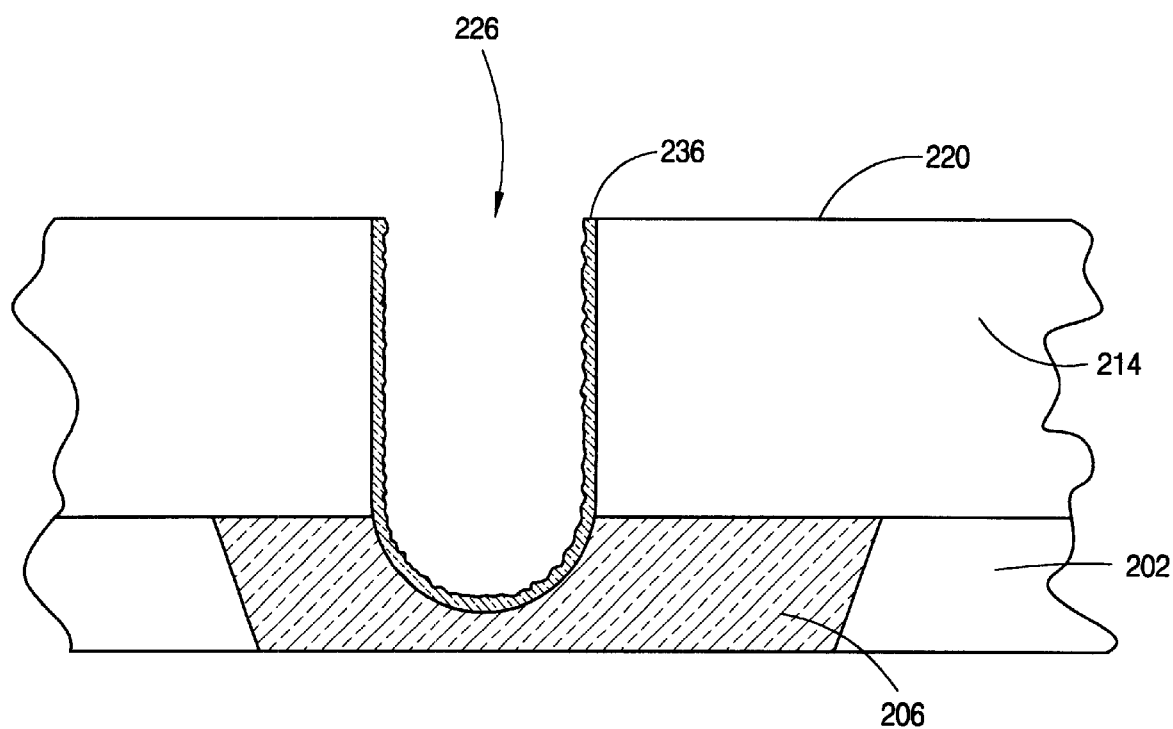

Referring now to FIG. 2F, a first film 236 is conformally layered over the interior surface of the container 226. The first film 236 may comprise an insulating or conducting material depending upon the desired functionality of the resulting structure. In the preferred embodiment, the first film 236 is formed from the same conductive material and during the same processing step as the formation of the bottom electrode of the capacitive storage cells in the DRAM chip. The first film 236 is intended to produce a rough surface to increase the surface area over which subsequent layers are deposited. In the preferred embodiment, the first film 236 comprises hemispherical grain polysilicon. For the purpose of defining the present invention, an insulating layer or material includes layers or material utilized in the art of semiconductor manufacture as insulating layers or dielectric layers. Similarly, a conductive layer or conductive material includes layers or materials utilized in the art of semiconductor manufacture as storage cell electrodes, connection electrodes, or other electrical connections associated with a semiconductor device.

In the preferred embodiment, the first film 236 is formed by a number of process steps typically performed during the normal course of forming capacitive storage cells. The first film material is initially deposited over the surface of the structure of FIG. 2E, including the upper overlayer surface 220 and the interior of the container. Next, a chemical mechanical polishing is used to remove the film material from the upper overlayer surface 220, leaving the first film material only within the container 226.

It will be understood, in view of the present disclosure, that in other arrangements the contact container 226 need not include the film 236 corresponding to the bottom electrode in other containers that form memory cells. Reference is made to FIG. 2C and the accompanying description.

Figure 2G:
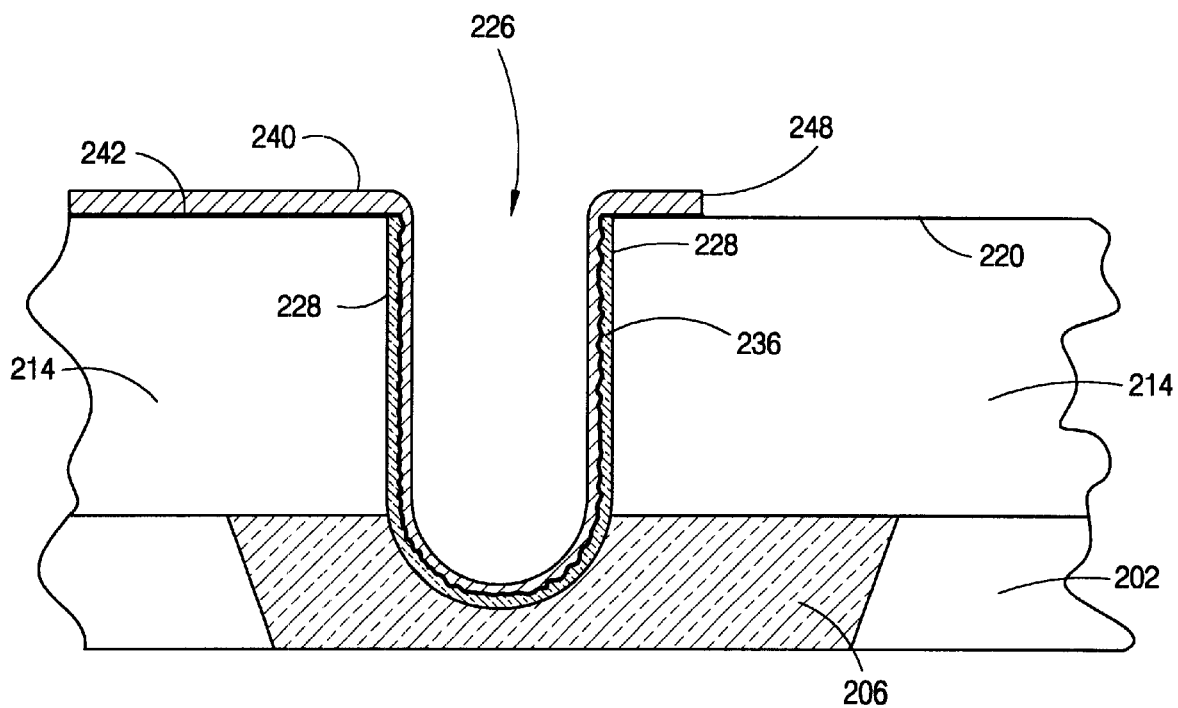

As illustrated in FIG. 2G, a conductive film 240, to which electrical contact will be formed is conformally layered over a portion of the upper overlayer surface 220 and over the interior of the container 226. The conductive film 240 is layered over a thin intervening cell dielectric film 242 and extends over the upper overlayer surface 220 up to an edge 248 located proximate one wall 228 of the container 226.

In the preferred embodiment, the dielectric film 242 is first deposited over the complete surface area to be covered by the conductive film 240. The dielectric film 242 is typically applied during the normal course of constructing capacitive storage cells and serves therein as an insulator between the first film 236 and the conductive film 240 so as to create a capacitor. The dielectric film 242 also ends at the edge 248 of the conductive film 240. The edge 248 of the conductive film 240 and dielectric film 242 layers is formed by first forming the films 240 and 248 over all of the upper overlayer surface 220. The edge 248 is then created by photolithographic patterning and etching away a section of the two films 240 and 248 as indicated. The conductive film 240 may comprise any of a variety of conductive materials suitable for semiconductor device fabrication. In the preferred embodiment, the conductive film 240 comprises a conventional doped polysilicon film formed by chemical vapor deposition. In other arrangements, the conductive film 240 can comprise a noble metal, such as platinum, or other non-oxidizing materials (e.g., TaN, TiN, $Ru_2O_3$, etc.).

Figure 2H:
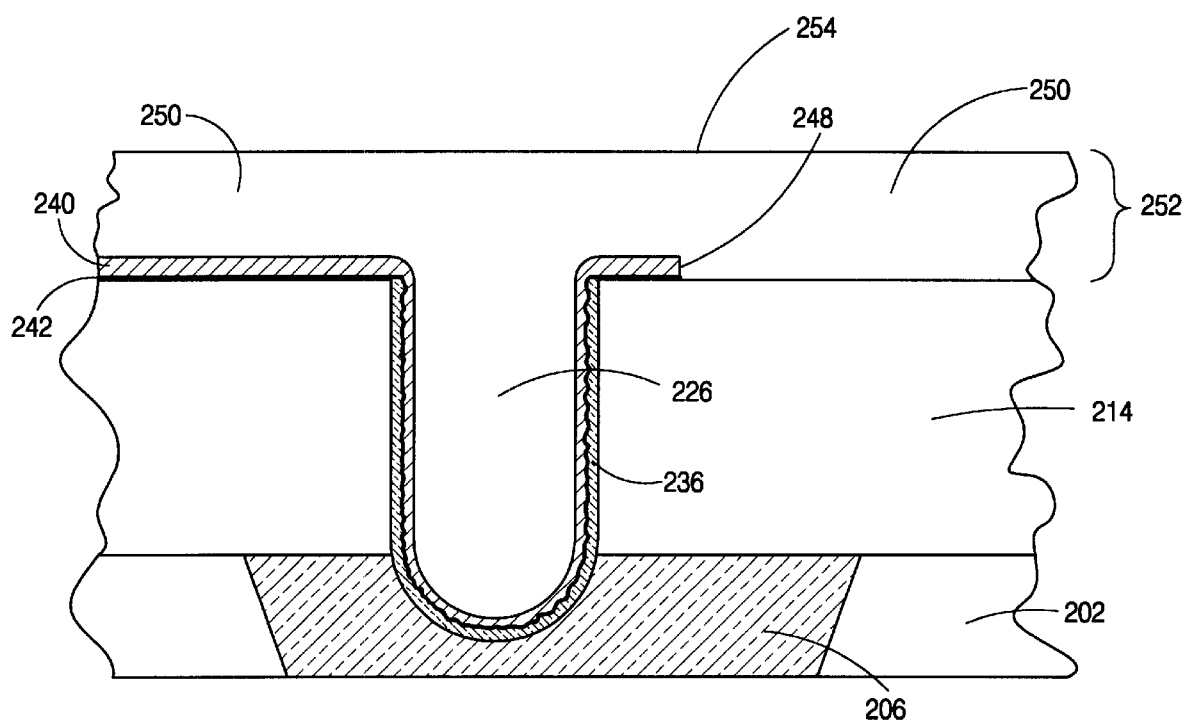
Figure 21:
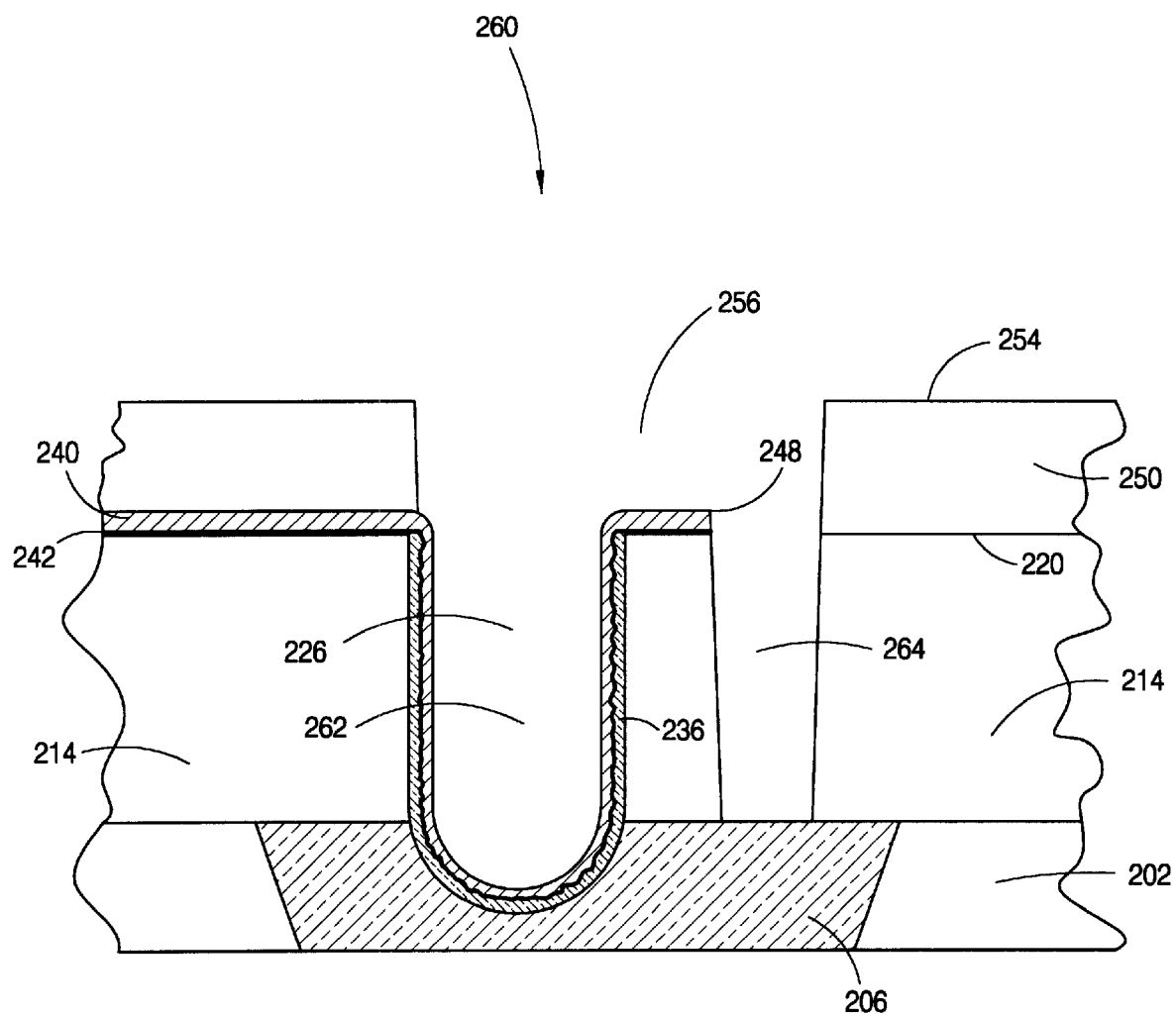

Referring now to FIG. 2H, a third insulating overlayer 250 is formed over the structure of FIG. 2G. The third insulating overlayer 250 fills the container 226 and also forms an additional top thickness 252 bounded by a third insulating overlayer surface 254. The third insulating overlayer 250 typically comprises a glass insulating layer, e.g., borophosphosilicate glass, but may comprise any suitable electrically insulating layer.

Referring now to the cross-section illustrated in FIG. 2I, a contact form 260, comprising a generally vertical contact leg section 262, a generally horizontal waist section 256, and a generally vertical anchor leg section 264, is formed within the third insulating overlayer 250 and the second insulating overlayer 214. In the illustrated embodiment, the contact form 260 thus generally resembles an inverted U-shape. One leg 262 extends into the high-surface area structure (container) of the thin film 240, while the second leg 264 is formed in a second high surface area structure adjacent the thin film 240. It will be understood that, in other arrangements, the high surface area structures can take other forms (e.g., studs, fins, etc.).

The waist section 256 is formed by removing a portion of the third insulating overlayer 250 over the container 226, over the surface of the conductive film 240 between the container 226 and the edge 248, and over a portion of the upper overlayer surface 220 adjacent the edge 248. In the preferred embodiment, the waist section 256 is located over a portion of the patterning stop region 206. The contact leg section 262 of the contact form 260 is created by removing a portion of the third insulating overlayer 250 within the container 226 to expose the surface of the conductive film 240 within the container 226.

The anchor leg section 264 is formed by removing a section of the second insulating overlayer 214 adjacent the edge 248 of the conductive film 240 and below the waist section 256, as illustrated. In the preferred embodiment the anchor leg section 264 extends from the upper overlayer surface 220 down to the lower overlayer surface 216 of the second insulating overlayer 214. In the preferred embodiment, the anchor leg section 264 extends down to the top of the patterning stop region 206.

The contact form 260 is preferably formed by using an etch that selectively removes the insulating overlayers 214 250, without significantly etching the conductive film 240 or the stop region 206. Fluorocarbon chemistries, for example, selectively etch oxides (such as the preferred overlayers 214, 250) as compared to silicon (such as the preferred conductive film 240 and stop rejion 206). Most preferably, the etch comprises a reactive ion etch (RIE).

In the preceding paragraphs, it has been purposely stated that portions (possibly including the whole) of the third insulating overlayer 250 and the second insulating overlayer 214 have been removed in various sections of the disclosed structure. As illustrated in the cross-section of FIG. 2I, for example, it appears that all of the third insulating overlayer 250 has been removed within the container 226. It is contemplated, however, that the contact window could completely or only partially overlap the container structure 226, as will be better understood in view of top plan views (FIG. 3) and attendant description.

Figure 2J:
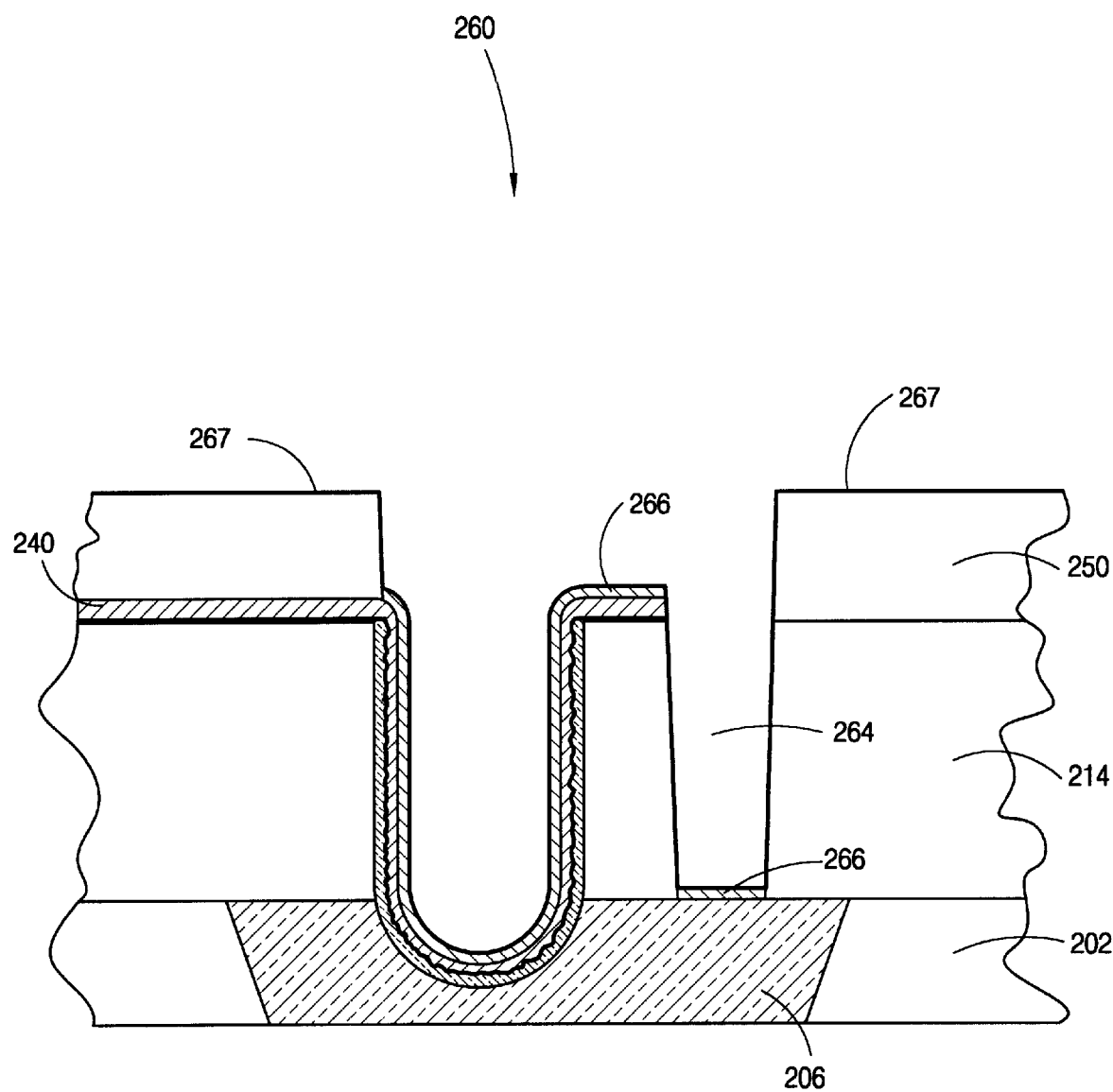
Figure 2K:
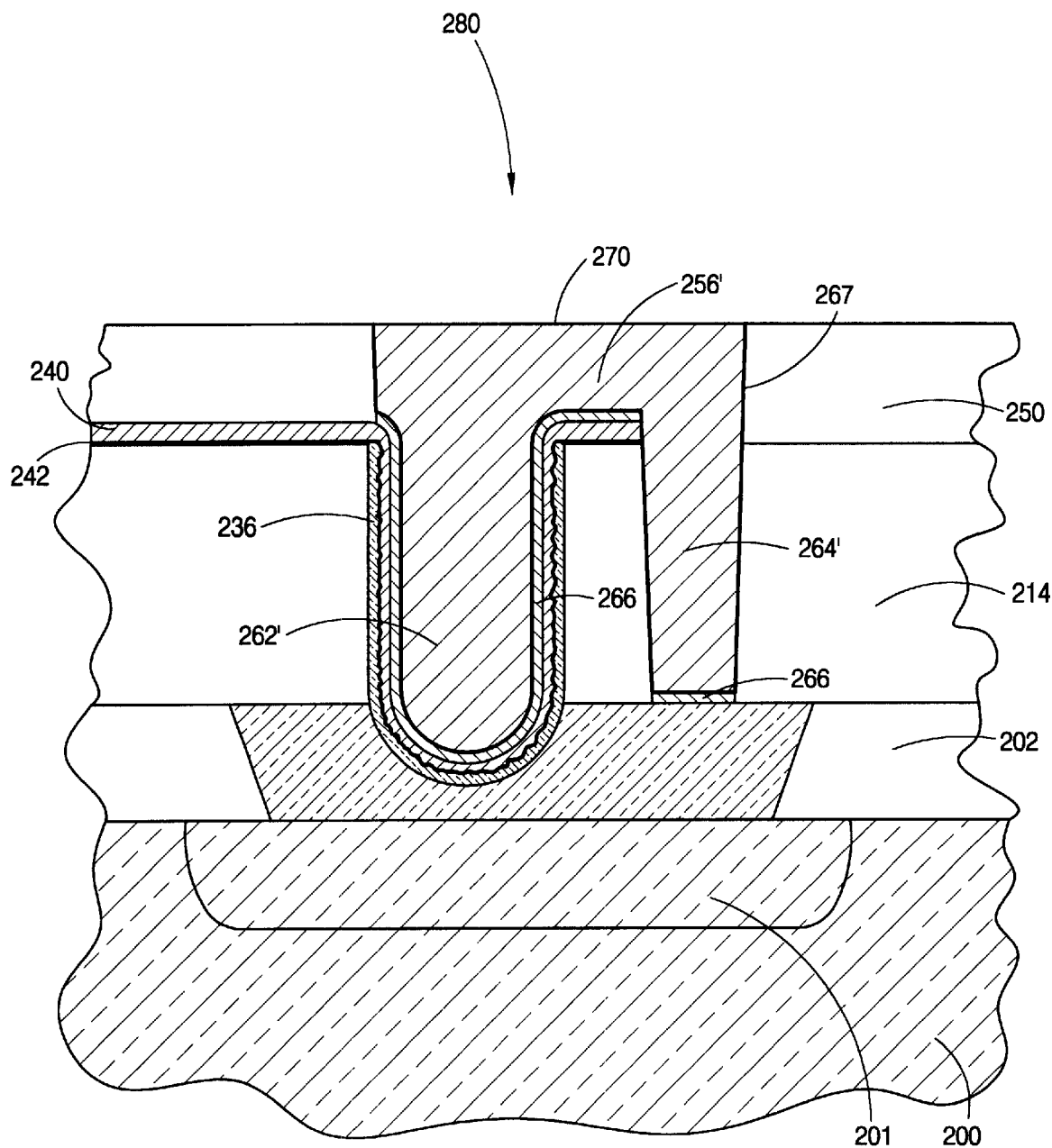

Referring to FIG. 2J, the contact form 260 in the preferred embodiment is lined with a number of layers to promote electrical contact and adhesion between the conductive film 240 and the contact. First, a layer of titanium silicide 266 is selectively formed over any exposed polysilicon surfaces using chemical vapor deposition (CVD) at a temperature of greater than approximately 600° C. In the illustrated embodiment, the layer of titanium silicide 266 selectively forms on the exposed surface of the conductive film 240 and the exposed surface of the patterning stop region 206. The titanium silicide layer 266 creates a metal-semiconductor ohmic contact and prevents the unintended creation of a Schottky diode. Next, a layer of titanium nitride 267 is conformally layered, preferably by MOCVD, over the entire exposed surface of the structure. The titanium nitride layer 267 serves as a barrier film for the subsequent deposition of metal and also serves as an adhesive layer to secure the preferred tungsten metal to the underlying structure.

As illustrated in FIG. 2K, a conductive material is deposited in the contact form 260 to form an anchored contact or conductive plug 270 having the shape and features of the contact form 260. Preferably, the conductive material comprises a conformal metal. For the purpose of the present description, the contact 270 includes the conductive material as well as any adjacent layers promoting electrical contact and/or adhesion, such as, for example, the titanium silicide layer 266 or the titanium nitride layer 267 of FIG. 2J.

Referring to FIG. 2K, the junction between the anchored contact 270 and the conductive film 240 forms the electrical contact of the contact structure 280. The contact leg 262N makes contact to the conductive film 240 all along the surface of the container 226. The waist section 256N also makes contact to the conductive film 240 along the exposed portion of the conductive film 240 between the container 226 and the anchor leg 264N. The electrical contact between the anchored contact 270 and the conductive film 240 is enhanced as a result of the high surface area of the conductive film 240 within the container 226.

A first path of electrical contact to the conductive film 240 can achieved by making contact to the anchored contact 270 from above. In the preferred embodiment of the present invention, the patterning stop region 206 is formed with a conductive material. This embodiment enables a second path of electrical contact to occur through the anchor leg 264' of the anchored contact 270. The anchor leg 264' contacts the patterning stop region 206, which in turn contacts the underlying active area 201. For such an arrangement, the active area is desirably biased to the same voltage as the cell plate.

The resulting contact structure 280 has an extensive surface area and structure to secure the anchored contact 270 in place during subsequent processing steps. In the preferred embodiment, a number of process steps are conducted between formation of the container 226 and the depositing of the anchored contact 270. These process steps may introduce variability into the dimensions of the container 226, resulting in a possibly thin metal plug as in the previous designs illustrated in FIGS. 1D–E. The anchor leg 264 of the contact form 260, however, is formed just prior to depositing the anchored contact 270. Thus, there is less opportunity for variations in the process steps to affect the desired dimensions of the anchor leg 264' of the anchored contact 270. In addition to being less susceptible to process variations, the disclosed anchored contact 270 itself can more than double the anchoring surface area by which the contacts of previous designs were held in place. Accordingly, the anchor leg 264' provides an additional structure to hold the anchored contact 270 in place during subsequent processing steps.

Figure 2L:
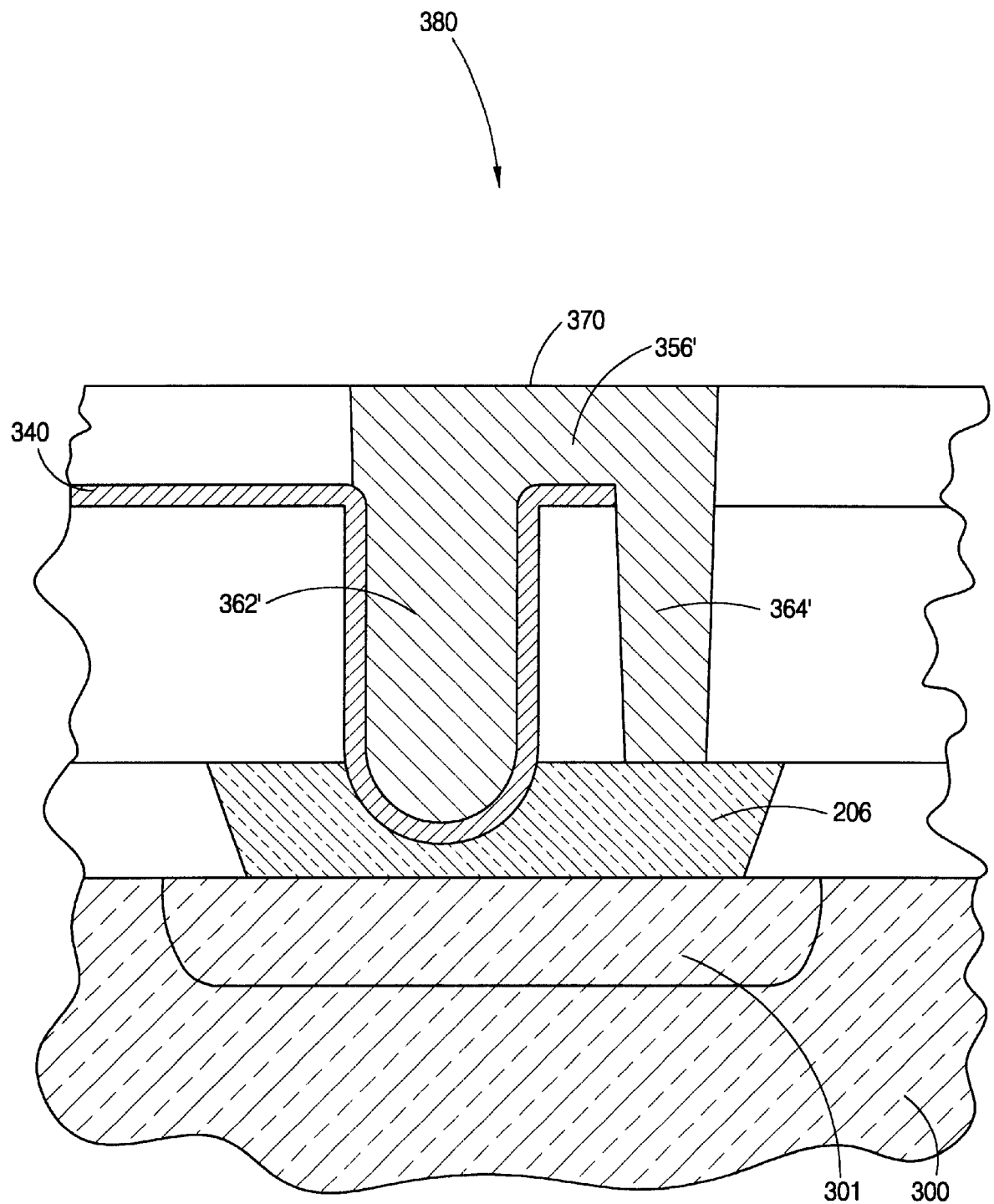
FIG. 2L illustrates a final contact structure in accordance with an alternative embodiment.

With reference now to FIG. 2L, an alternative contact structure is illustrated, wherein features similar to those of FIG. 2K are referenced by 300-series numbers with the same last two digits as that of corresponding features of the embodiment of FIG. 2K. As shown, the thin film 340 lines the first container-shape without any intervening conductive layer. In the embodiment of FIG. 2K, layer 236 represents the layer that forms a bottom electrode in adjacent memory cell containers (not shown), such that the container serves as a "dummy" capacitor, but does not actually electrically operate as a capacitor. In the previously described embodiment, layer 236 was allowed to line the container simultaneously as it was formed in adjacent capacitors, as a process expedient compared to forming a separate mask to prevent deposition in the contact container.

FIG. 2L, on the other hand, represents a more general form of contact structure 370. Such a structure 370 can be formed in a DRAM array context, where the contact container is either protected from deposition of the bottom electrode across the remainder of the array, or the bottom electrode layer is removed from the container prior to formation of the conductive thin film 340. The contact structure 370 can also represent a structure for contacting the thin film 340 in any other context. As noted with respect to the previous embodiment, a contact leg 362' can also take on other shapes that provide high surface contact areas, such as stud shapes, fin structures, etc.

A number of process steps have been described with reference to FIGS. 2A–K. The process steps have been described at a level of detail so as to enable one skilled in the art to practice the present invention without unnecessarily obscuring the novel aspects thereof. A number of process steps that would be recognized as incidentally necessary by one skilled in the art have not been described or included. Such process steps may include photolithography related steps or other basic steps, well known in the art, needed to achieve the disclosed structures. Other process steps could also be added during the formation of the disclosed contact structure 280 while still falling within the scope and spirit of the present invention. The formation of the container 226, for example, can be shared with steps used to form the containers of capacitive storage cells.

Figure 3A:
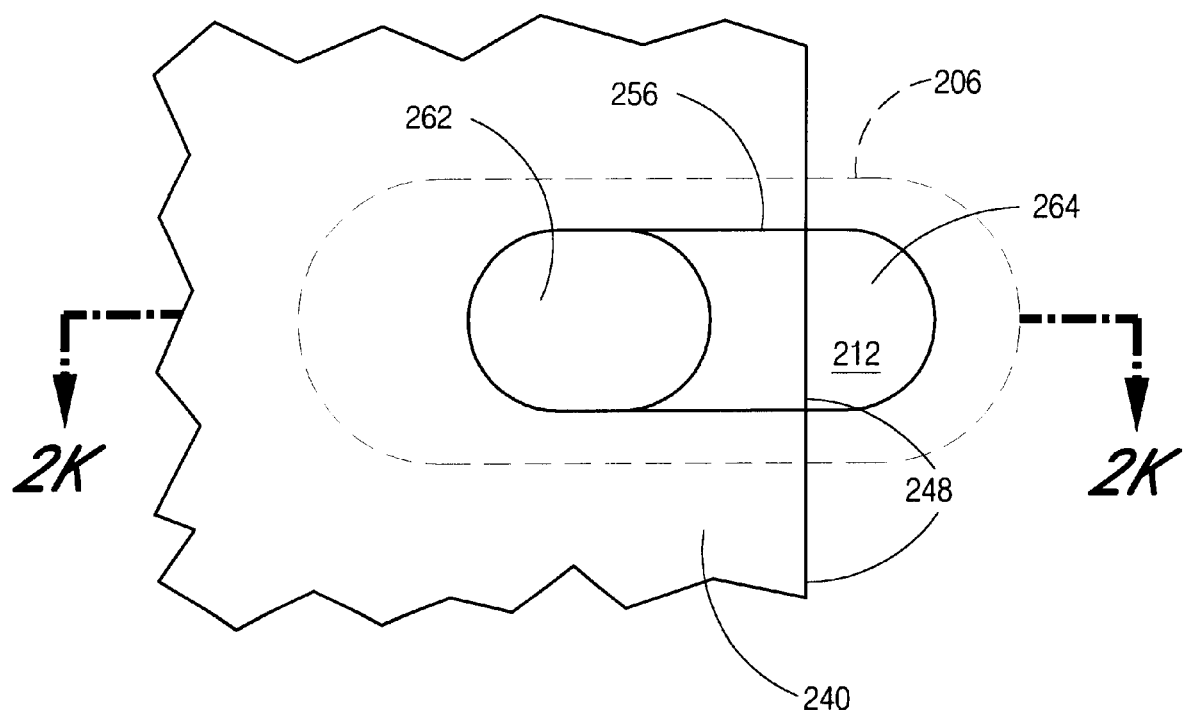
FIGS. 3A–B illustrate the layout and mask patterns of two embodiments of the present invention when viewed from overhead.

FIG. 3A is a top plan view of the preferred embodiment of the structure of FIG. 2I. The cross-sections depicted in FIGS. 2A–K are taken along lines 2K—2K as indicated. The patterning stop region 206, which would not be visible at this stage, has an oval structure as shown by the dashed line. The conductive film 240 can extend in any of three directions as indicated. The horizontal waist section 256 overlaps the generally vertical contact leg 262, and extends beyond the edge 248 of the conductive film 240 to overlap the generally vertical anchor leg 264. The upper patterning stop region surface 212 is visible at the bottom of the anchor leg 264.

Figure 3B:
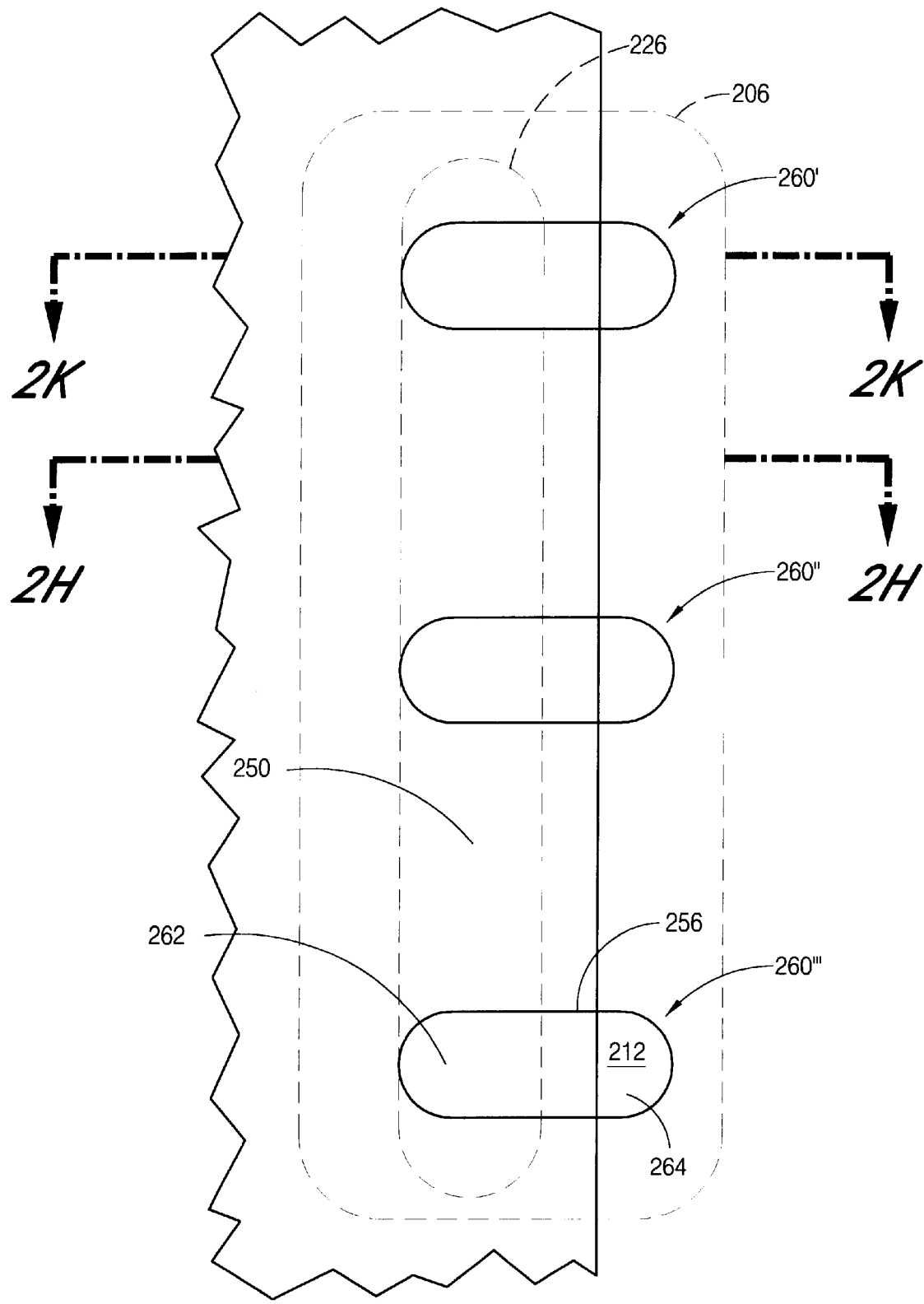

FIG. 3B is a top plan view of a second embodiment of the structure of FIG. 2I. The patterning stop region 206, which would not be visible at this stage, has a rectangular slot shape as shown by a dashed line. The present embodiment incorporates three contact forms 260', 260", and 260'" into a single oblong container 226 indicated by a dashed line. In the present embodiment, the container 226 comprises a long, trench-like structure rather than the finger-like cavity of the previous embodiment. Although three contact forms 260 are disclosed in the present embodiment by way of example, any suitable number of contact structures can be utilized. The conductive film 240 can extend in any of three directions as indicated. The waist section 256 of each of the contact forms 260', 260", 260'", overlaps the contact leg 262, and extends beyond the edge 248 of the conductive film 240 to overlap the anchor leg 264.

The cross-sections depicted in FIGS. 2A–K are taken along line 2K—2K as indicated. The process steps depicted in FIGS. 2I–K, however, are not applied along line 2H—2H, as indicated. Thus, the third insulating overlayer 250 remains intact along line 2H—2H. In this manner, three contact forms are created within one oblong container 226. Each contact form 260 only occupies a portion of the container 226. In the portions of the container 226 where the contact structure is not formed, the third insulating overlayer 250 as illustrated in FIG. 2H remains in place. The contact form 260 of the embodiment illustrated in FIG. 3A, on the other hand, typically occupies most or all of the container, leaving little or none of the third insulating overlayer 250 within the container 226.

Figure 4A:
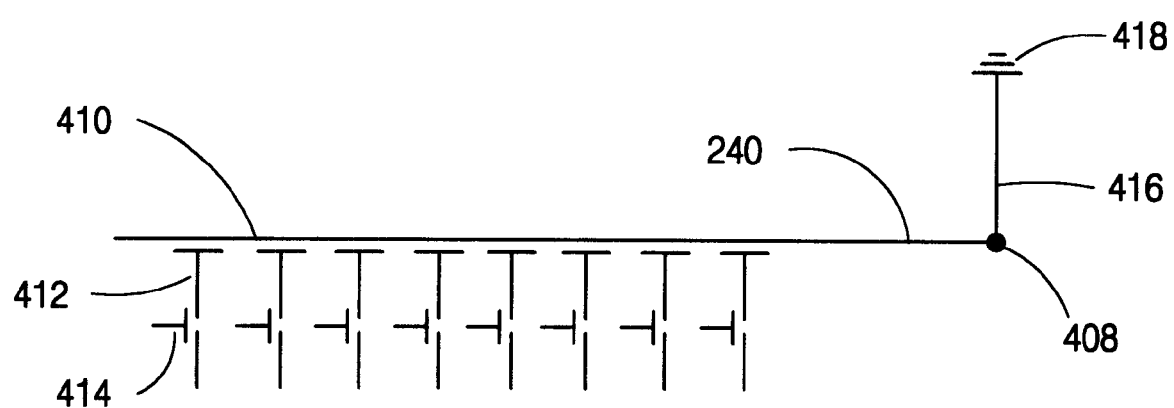
FIG. 4A illustrates a schematic diagram of the use of one embodiment of the present invention to contact a cell plate of a capacitive storage cell.

As illustrated in the schematic diagram of FIG. 4A, the preferred embodiment of FIG. 3A is intended to serve as a contact 408 to a common top cell plate 410 of an array of capacitive storage cells 412. The capacitive storage cells 412 all share the same top cell plate 410, which extends over the whole array of storage cells 412. The common cell plate 410 in this case is formed from the same conductive film 240 of the contact structure 280 (FIG. 2K) of the present invention. The conductive film 240 of the present invention is extended from the common top cell plate 410 as illustrated in FIG. 3A. Contact between the cell plate 410 and a source of common potential for the capacitive storage cells 412, is provided through a conductive path 416, which is established through the contact 408 of the present invention. The conductive path 416 may be tied to a ground or zero potential 418. The contact 408 serves to electrically connect the cell plate 410 to the conductive path 416. The bottom plate of each capacitive storage cell 412 is accessed through a transistor switch 414 the use and construction of which is well known in the art. Referring back to FIG. 3A, the cell plate 410 occupies a region to the left of the figure and makes contact, through the disclosed structure, to the conductive path 416.

Figure 4B:
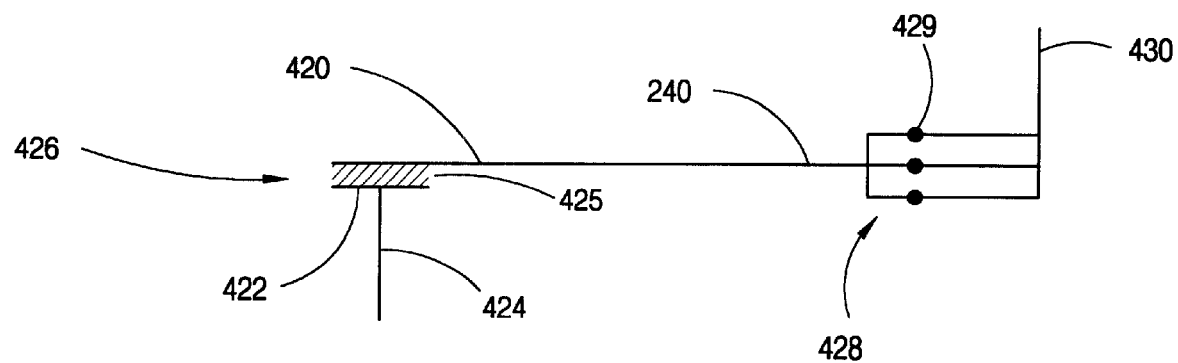
FIG. 4B illustrates a schematic diagram of the use of one embodiment of the present invention to contact a cell plate of an antifuse.

As illustrated in the schematic diagram of FIG. 4B, the embodiment depicted in FIG. 3B is intended to serve as a contact 428 to a top plate 420 of an antifuse 426. An antifuse functions in the opposite manner of a typical fuse. Antifuses are well known in the art and can be constructed in a manner similar to the capacitive storage cells of DRAM memory. Antifuses are typically used in DRAM memory devices to effectuate redundant element programming in accordance with techniques well known in the art. The antifuse 426 comprises a top plate 420 and a bottom plate 422, with a dielectric material 425 sandwiched between the two plates. When constructed, an antifuse 426 acts as an open circuit. When overdriven with a high pulsed voltage, the dielectric material 425 breaks down and the antifuse 426 permanently changes to a closed circuit contact.

Referring to FIG. 4B, the top plate 420 of the antifuse 426 is formed from the conductive film 240 of the disclosed structure, which is extended beyond the antifuse structure 426 to the disclosed contact structure 428. As illustrated in FIGS. 3B and 4B, three points of contact 429 are formed through the disclosed contact structure 428 to a conductive path 430. Although a number of points of contact 429 are disclosed in the present embodiment by way of example, the present invention shall not be construed to be limited to a particular number of points of contact 429. When the antifuse 426 is overdriven, the conductive path 430 is extended through the contact structure 428 and the antifuse 426 to the conductive path 424. Accordingly, permanently closed circuits may be formed using antifuses after a semiconductor chip has been fabricated to effectuate redundant element programming.

The disclosed embodiments can be employed in a DRAM chip where reliable electrical contacts to an internal conductive layer must be provided. A DRAM chip is a rectangular array of capacitive storage cells 412 organized to store binary information through storage of different levels of voltage. The capacitive storage cells are formed from a top plate and a bottom plate separated by a dielectric layer. A transistor structure is connected to the bottom plate to provide access to the charge stored in each charge storage region. Each transistor functions as an on-off switch to open the communication lines between the charge storage region and a microprocessor in communication with the DRAM chip. As described above, all of the storage cells in an array can share the same cell top plate. The present invention can be employed to create contacts around the perimeter of a common cell top plate.

Redundant element programming can be used to circumvent defects in the manufacturing process in accordance with techniques that are well known in the art. The present invention can be employed to effectuate contacts to antifuses required by redundant element programming techniques. Redundant element programming can be employed in the manufacture of DRAMs as well as other types of semiconductor chips.

Although the present invention has been described with reference to a number of preferred embodiments, it could be employed to form a contact to any thin film or conductive film in a semiconductor manufacturing context. Implementations can range from the manufacture of liquid crystal displays to microprocessors.

Semiconductor devices incorporating the present invention, such as, for example, DRAMs, can be incorporated into complete computer systems or electronic components. Computer systems incorporating the present invention would typically comprise a central processing unit or microprocessor, memory (in the form of DRAM or otherwise), mass storage, a display, other output devices (e.g. a printer), a number of input devices, and possibly a number of networking devices.

While certain exemplary preferred embodiments have been described and shown in the accompanying drawings, it is to be understood that such embodiments are merely illustrative of and not restrictive on the broad invention. Further, it is to be understood that this invention shall not be limited to the specific construction and arrangements shown and described since various modifications or changes may occur to those of ordinary skill in the art without departing from the spirit and scope of the invention as claimed. It is intended that the scope of the invention be limited not by this detailed description but by the claims appended hereto.

We claim:

1. A contact structure configured to make electrical contact to a conductive film of an integrated circuit, the structure comprising a contact formed from a contiguous volume of conductive material, the contact comprising a contact leg, an anchor leg configured to anchor the contact in place, and a waist section joining the contact leg and the anchor leg, wherein the conductive film lines substantially all of the contact leg but substantially none of the anchor leg, and wherein the waist section extends over substantially all of the contact leg and the anchor leg.

2. The structure of claim 1, wherein a depth divided by width aspect ratio of the contact leg is at least one to one.

3. The structure of claim 2, wherein a depth divided by width aspect ratio of the anchor leg is at least one to one.

4. The structure of claim 3, wherein the structure serves as an electrical contact to a cell plate of an array of capacitive storage cells in a DRAM chip.

5. The structure of claim 3, wherein the structure serves as an electrical contact to an antifuse in a DRAM chip.

6. An electrical contact structure in an integrated circuit, the contact structure comprising:
- a first container shaped surface defining a first volume wherein substantially all of the first container shaped surface is formed from a conductive material;
- a second container shaped surface defining a second volume proximate the first volume, wherein at least a portion of the second container shaped surface is formed from an insulating material; and
- a contact making electrical contact to the first container shaped surface, the contact comprising a contiguous volume of conductive material occupying substantially all of the first volume, substantially all of the second volume, and a space extending over substantially all of: the first volume, the second volume, and an area between the first volume and the second volume.

7. The structure of claim 6, wherein the contact is anchored through the second surface.

8. The structure of claim 7, wherein a depth to width aspect ratio of the first volume is at least one to one.

9. The structure of claim 8, wherein a depth to width aspect ratio of the second volume is at least one to one.

10. The structure of claim 7, wherein the contact directly contacts the second surface.

11. An electrical contact structure in an integrated circuit, the contact structure comprising:
- a first container shaped surface defining a first volume wherein a portion of the first container shaped surface is formed from a conductive material, wherein substantially all of the first container shaped surface is formed from a conductive material, and wherein a depth to width aspect ratio of the first volume is at least one to one;
- a second container shaped surface defining a second volume proximate the first volume, wherein a portion of the second container shaped surface is formed from an insulating material, and wherein a depth to width aspect ratio of the second volume is at least one to one; and
- a contact making electrical contact to the conductive portion of the first container shaped surface, the contact comprising a contiguous volume of conductive material occupying a portion of the first volume and substantially all of the second volume, wherein the contact is anchored through the second surface, and wherein the contact substantially fills the first volume.

12. An electrical contact structure in an integrated circuit, the contact structure comprising:
- a first container shaped surface defining a first volume wherein a portion of the first container shaped surface is formed from a conductive material;
- a second container shaped surface defining a second volume proximate the first volume, wherein a portion of the second container shaped surface is formed from an insulating material;
- a contact making electrical contact to the conductive portion of the first container shaped surface, the contact comprising a contiguous volume of conductive material occupying a portion of the first volume and substantially all of the second volume, wherein the contact is anchored through the second surface;
- an additional container shaped surface defining an additional volume proximate the first volume, wherein a portion of the additional container shaped surface is formed from an insulating material; and
- an additional contact making electrical contact to the conductive portion of the first container shaped surface, the additional contact occupying a portion of the first volume and a portion of the additional volume.

13. A method of fabricating an electrical contact to a conductive film of an integrated circuit, the method comprising:
- forming a first container shaped surface defining a first volume wherein substantially all of the first container shaped surface is formed from a conductive material;
- forming a second container shaped surface defining a second volume proximate the first volume, wherein at least a portion of the second container shaped surface is formed from an insulating material; and
- forming a contact to make electrical contact to the first container shaped surface by depositing a contiguous volume of conductive material in substantially all of the first volume, substantially all of the second volume, and a space extending over substantially all of: the first volume, the second volume, and an area between the first volume and the second volume.

14. An electrical contact structure in an integrated circuit, the contact structure comprising:
- a first container shaped surface defining a first volume wherein a portion of the first container shaped surface is formed from a conductive material;
- a second container shaped surface defining a second volume proximate the first volume, wherein a portion of the second container shaped surface is formed from an insulating material;
- a contact making electrical contact to the conductive portion of the first container shaped surface, the contact comprising a contiguous volume of conductive material occupying a portion of the first volume and a portion of the second volume;
- a third container shaped surface defining a third volume proximate the first volume, wherein a portion of the third container shaped surface is formed from an insulating material; and
- a second contact making electrical contact to the conductive portion of the first container shaped surface, the second contact occupying a portion of the first volume and a portion of the third volume.

15. The structure of claim 14, wherein the structure serves as an electrical contact to an antifuse in a DRAM chip.

16. An electrical contact structure in an integrated circuit, the contact structure comprising:
- a first container;
- a second container proximate the first container;
- a conductive film lining substantially all of the first container but substantially none of the second container; and
- a contact making electrical contact to the conductive film, the contact comprising a contiguous volume of conductive material occupying substantially all of the first container, substantially all of the second container, and a space extending over substantially all of: the first container, the second container, and an area between the first container and the second container, wherein the second container provides a surface area through which the contact is anchored in place.

17. An electrical contact structure in an integrated circuit, the structure comprising:
- an insulating layer;
- a first depression formed in the insulating layer;

a second depression formed in the insulating layer proximate the first depression;

a conductive film lining substantially all of the first depression but substantially none of the second depression; and a contact making electrical contact to the conductive film, the contact comprising a contiguous volume of conductive material occupying substantially all of the first depression, substantially all of the second depression, and a space extending over substantially all of: the first depression, the second depression, and an area between the first depression and the second depression, wherein the second depression provides a surface area through which the contact is anchored in place.

18. The structure of claim 17, wherein the conductive film extends over a portion of a top surface of the insulating layer.

19. The structure of claim 17, wherein the contact further occupies a space above the insulating layer between the first depression and the second depression.

20. An electrical contact structure in an integrated circuit, the structure comprising:

an insulating layer;

a first container formed in the insulating layer;

a conductive film lining substantially all of the first container and extending out of the first container over the surface of the insulating layer up to an edge;

a second container formed in the insulating layer adjacent the edge, wherein the edge is between the first container and the second container; and a contact making electrical contact to the conductive film, the contact comprising a contiguous volume of conductive material within substantially all of the first container, substantially all of the second container, and a space extending over substantially all of: the first container, the second container, and an area between the first container and the second container, wherein the second container provides a surface area through which the contact is anchored in place.

21. The structure of claim 20, wherein the conductive film directly contacts the insulating layer within the first container.

22. An electrical contact structure in an integrated circuit, the structure comprising:

an insulating layer;

a first container formed in the insulating layer;

a conductive film lining the first container and extending out of the first container over the surface of the insulating layer up to an edge, wherein the conductive film directly contacts the insulating layer within the first container;

a second container formed in the insulating layer adjacent the edge;

a contact making electrical contact to the conductive film, the contact comprising a contiguous volume of conductive material within at least a portion of the first container and at least a portion of the second container, wherein the second container provides a surface area through which the contact is anchored in place;

an additional container formed in the insulating layer adjacent the edge; and an additional contact making electrical contact to the conductive film, the contact within at least a portion of the first container and a portion of the additional container.

23. An electrical contact structure in an integrated circuit, the contact structure comprising:

a conductive film having an upper surface with a container shaped section proximate an edge of the conductive film, wherein the container shaped section extends from an upper level to a lower level; and a contact making electrical contact to the conductive film, the contact comprising a contact leg occupying substantially all of the container shaped section and having a surface in contact with the conductive film, an anchor leg extending over the edge of the conductive film and below the upper level to anchor the contact in place, and a waist section joining the contact leg and the anchor leg, wherein the waist section extends over substantially all of the contact leg and the anchor leg.

24. An electrical contact structure in an integrated circuit, the structure comprising:

an insulating layer;

a container formed in the insulating layer;

a depression formed in the insulating layer proximate the container;

a conductive film lining substantially all of the container and substantially none of the depression;

a contact making electrical contact to the conductive film, wherein the contact occupies substantially all of: the container, the depression, and a space extending over substantially all of the container and the depression.

25. An electrical contact structure in an integrated circuit, the contact structure comprising:

a layer of material having a top surface and an interior portion;

a first container formed in the layer of material, wherein the first container has an interior surface and wherein the first container extends from the top surface into the interior portion of the layer of material;

a conductive film conformally formed over substantially all of the interior surface of the first container and a portion of the top surface, wherein the conductive film extends over the top surface up to an edge, the edge being proximate the first container;

a second container formed in the layer of material adjacent the edge, wherein the second container extends from the top surface into the interior portion of the layer of material; and a contact making electrical contact to the conductive film, the contact having a contact leg occupying substantially all of the first container, an anchor leg occupying substantially all of the second container, and a waist section extending over substantially all of the contact leg and the anchor leg, wherein the second container provides a surface area through which the contact is anchored in place.

26. The structure of claim 25, wherein the contact comprises a contiguous volume of conductive material.

27. The structure of claim 26, wherein the contact further occupies a space above the conductive film between the first container and the second container.

28. The structure of claim 27, wherein the layer of material comprises a plurality of forming layers.

29. The structure of claim 28, wherein the plurality of forming layers comprises an insulating layer.

30. A structure for an electrical contact to a cell plate of an array of capacitive storage cells in a DRAM chip, the structure comprising a contact formed from a contiguous volume of conductive material, the contact comprising a contact leg, an anchor leg configured to anchor the contact in place, and a waist section joining the contact leg and the anchor leg, wherein the cell plate lines substantially all of the contact leg but substantially none of the anchor leg, and wherein the waist section extends over substantially all of the contact leg and the anchor leg.

31. An integrated circuit comprising:

a substrate including a semiconductor structure;

an electrical contact structure comprising a contact formed from a contiguous volume of conductive material, the contact comprising a contact leg, an anchor leg configured to anchor the contact in place, and a waist section joining the contact leg and the anchor leg, wherein the waist section extends over substantially all of the contact leg and the anchor leg; and a conductive film lining substantially all of the contact leg but substantially none of the anchor leg.

32. The integrated circuit of claim 31, further comprising a number of capacitive storage cells, wherein the conductive film forms a common cell plate of the capacitive storage cells, and wherein the electrical contact structure forms an electrical contact to the common cell plate.

33. The integrated circuit of claim 31, further comprising an antifuse, wherein the conductive film forms a plate of the antifuse.

34. A computer system comprising:

an input device;

an output device; and a number of integrated circuits comprising a processor and memory, wherein at least one integrated circuit comprises:

a substrate including a semiconductor structure;

an electrical contact structure comprising a contact formed from a contiguous volume of conductive material, the contact comprising a contact leg, an anchor leg configured to anchor the contact in place, and a waist section joining the contact leg and the anchor leg, wherein the waist section extends over substantially all of the contact leg and the anchor leg; and a conductive film lining substantially all of the contact leg but substantially none of the anchor leg.

* * * * *